(12) United States Patent
Visocchi

(10) Patent No.: US 6,879,217 B2
(45) Date of Patent: Apr. 12, 2005

(54) TRIODE REGION MOSFET CURRENT SOURCE TO BIAS A TRANSIMPEDANCE AMPLIFIER

(75) Inventor: Pasqualino Michele Visocchi, Barnet (GB)

(73) Assignee: Gennum Corporation, Burlington (CA)

( * ) Notice: Subject to any disclaimer, the term of this patent is extended or adjusted under 35 U.S.C. 154(b) by 21 days.

(21) Appl. No.: 10/655,461

(22) Filed: Sep. 5, 2003

(65) Prior Publication Data

US 2005/0052247 A1 Mar. 10, 2005

(51) Int. Cl.[7] .............................................. H03F 3/08
(52) U.S. Cl. ................................ 330/308; 250/214 A
(58) Field of Search ................................ 330/308, 254, 330/256, 259, 260; 250/214 A

(56) References Cited

U.S. PATENT DOCUMENTS 5,874,861 A * 2/1999 Nagase et al. ............. 330/308
5,912,590 A * 6/1999 Miyano ...................... 330/302
6,590,455 B1 * 7/2003 Kobayashi .................. 330/308

* cited by examiner

Primary Examiner—Henry Choe
(74) Attorney, Agent, or Firm—Kenyon & Kenyon

(57) ABSTRACT

Transimpedance amplifiers (TIAs) are typically used within optical receiver modules to amplify weak photocurrents received from the photodetector, in the form of photodiode, or a PIN diode. Since TIAs are used to amplify weak photocurrents, noise in the resultant amplification of the weak photocurrent is typically a problem. However, TIAs must not only provide low noise amplification of weak photocurrents, but must also operate when a much higher optical power is received by the photodetector and hence a much higher photocurrent is provided to an input port of the TIA. Of course, with the higher photocurrent received from the photodetector the TIA must also exhibit acceptable bit error rate performance as with the lower photocurrents. An elevated front end TIA (EFTIA) is thus provided that offers low noise performance while providing a wide dynamic range, which overcomes the deficiencies of the prior art.

17 Claims, 3 Drawing Sheets ized. In U.S. Pat. No.

TRIODE REGION MOSFET CURRENT SOURCE TO BIAS A TRANSIMPEDANCE AMPLIFIER

FIELD OF THE INVENTION

The invention relates to the field of amplifier circuits and more specifically to the field of current sources for realizing low noise and wide dynamic range in transimpedance amplifier circuits.

BACKGROUND OF THE INVENTION

The ever increasing demands for high capacity communications systems has resulted in a wide spread deployment of optical fiber networks across the world. A fundamental component used in such systems receives pulses of light and converts these into electrical signals. The pulses of light in such systems comprise a bit stream of information. This fundamental component employed in the fiber optic networks is commonly known as an optical receiver module. Within the optical receiver, a photodetector is typically employed to receive the light pulses and an amplifying circuit is employed for amplifying photocurrent generated within the photodetector.

Transimpedance amplifiers (TIAs) are typically used within optical receiver modules to amplify and transform weak photocurrents received from the photodetector, in the form of a photodiode or a PIN diode. The TIA amplifies and transforms the photocurrent into an output voltage that is further provided to other stages of the optical receiver module. Since TIAs are used to deal with both strong and weak photocurrents, noise in the resultant amplification and transformation to a voltage signal is typically a problem. Indeed, for those skilled in the art of the design of TIAs, it is well understood and appreciated that the noise introduced by the TIA, in many circumstances, limits the ability of the optical receiver module to faithfully reconstruct the intended stream of information. Furthermore, a relationship between the rate at which the receiver produces errors—often called the Bit Error Rate (BER), and the noise generated by the TIA can be shown. Thus, the optical receiver module needs to have low noise amplification performed on the weak photocurrents in order to facilitate optical transmission of information. This is especially true in circumstances where the distance that the optical signal must travel is long and results in weak optical pulses at the receiver. It is known to those skilled in the art that long transmission distances—the distance between a transmitter and a receiver—serves to attenuate the initial transmitted optical signal strength and places a greater burden upon the receiver module to avoid errors. Furthermore, it is also known that cost of an optical communication system is reduced if a signal is transmitted along a longer length of optical fiber or, in the alternative, if less optical power is transmitted. Thus, providing low noise amplification for the TIA is important in order to reduce the bit error rate (BER) of the received and amplified signal.

However, TIAs must not only provide low noise amplification of weak photocurrents, but must also operate when a much higher optical power is received by the photodetector and hence a much higher photocurrent is provided to an input port of the TIA. Thus, the TIA must exhibit wide dynamic range operation so that it does not suffer from input photocurrent overload, where the output voltage from the TIA is no longer linearly proportional to the input photocurrent. For example, if a TIA is used with a short transmission length of optical fiber, then the optical signal power levels received by the photodetector and amplified accurately can be much higher than when the TIA operates with much longer transmission lengths. Of course, with the higher photocurrent received from the photodetector, the TIA must also exhibit acceptable BER performance as with the lower photocurrents.

In practice, in order to achieve a wide dynamic range for TIA operation, some form of switching circuit is typically used, or in some cases, an AGC is utilized in order to vary the transimpedance gain of the TIA. In U.S. Pat. No. 6,218,905, entitled "Common-gate transimpedance amplifier with dynamically controlled input impedance," an AGC is utilized in order to vary the gain of the TIA. In U.S. Pat. No. 6,297,701, entitled "Wide dynamic range transimpedance amplifier," an AGC function is realized by a transistor switching network.

The most commonly used photodiode detector is the PIN diode, were the anode is usually connected to the input of the TIA while the cathode is connected to the positive voltage rail. Depending upon the type of PIN diode used, the wavelength of operation and possibly the data rate, the amount of reverse voltage required to allow the PIN diode to operate within its full dynamic range—from maximum sensitivity to overload—can vary between 5V to 0.8V. The reverse bias voltage requirement often dictates the circuit architecture of the front end transimpedance stage, which provides the input bias voltage to the PIN diode. As a result, performance compromises between sensitivity and overload typically occur.

If high optical sensitivity is required from the receiver, the TIA input bias voltage is required to be as low as possible (0.8V), which provides maximum reverse bias voltage, thus the PIN diode exhibits minimum detector capacitance. However, this design approach reduces the overload performance of the TIA. On the other hand, if a higher overload is required, a TIA requires a higher input bias voltage, which in turn reduces the PIN diode reverse bias voltage, increasing the detector capacitance and reducing the optical receiver's sensitivity. The issue is exacerbated if a further requirement is to provide a 3.3V single rail operation, which can often restrict the input bias voltage required to offer both high sensitivity and overload performance from the TIA.

A need therefore exists to provide a high reverse bias voltage required by a PIN diode operating at 1300–1550 nm wavelength and 10 Gbit/s from a 3.3V single supply rail and to providing sufficient reverse bias voltage to allow full dynamic range to be achieved without significant compromise in sensitivity and overload performance of the TIA.

It is therefore an object of the invention to provide a TIA that offers wide dynamic range operation without resulting in a significant compromise between sensitivity and overload performance. It is a further object of the invention to provide a current source for biasing of the TIA.

SUMMARY OF THE INVENTION

In accordance with the invention there is provided a circuit comprising: a transimpedance amplifier (TIA) circuit comprising a TIA input port, a first supply voltage input port, a second supply voltage input port, and a first amplification stage; a first MOSFET current source for receiving a feedback signal and for providing a first current to the first amplification stage; and, a feedback circuit for providing the feedback signal to the first MOSFET current source; a dummy TIA stage for replicating DC characteristics of the TIA circuit and for providing a control signal to the feedback circuit; and, a bias circuit for providing a bias voltage within a predetermined range below a first potential of the first supply voltage input port to the TIA input port.

In accordance with the invention there is provided a circuit comprising: a transimpedance amplifier (TIA) circuit comprising a TIA input port, a first supply voltage input port, a second supply voltage input port, and a first amplification stage; a first MOSFET current source for receiving a feedback signal and for providing a first current to the first amplification stage; and, a feedback circuit for providing the feedback signal to the first MOSFET current source; a dummy TIA stage for replicating DC characteristics of the TIA circuit and for providing a control signal to the feedback circuit; a bias circuit for providing a reverse bias voltage within a predetermined range below a first potential of the first supply voltage input port to the TIA input port; and, a PIN diode connected to the TIA input port, where the reverse bias voltage available to the PIN diode is between 2.0V and 1.5V.

In accordance with the invention there is provided a circuit comprising: a transimpedance amplifier (TIA) circuit comprising a TIA input port, a first supply voltage input port, a second supply voltage input port, and a first amplification stage; a first MOSFET current source comprising a first MOSFET for operating in a triode region for and for receiving a feedback signal and for providing a first current to the first amplification stage, the first current being relatively insensitive to at least one of temperature, DC supply voltage, and first MOSFET manufacturing tolerances; a feedback circuit for providing the feedback signal to the first MOSFET current source; a dummy TIA stage for replicating DC characteristics of the TIA circuit and for providing a control signal to the feedback circuit; and, a bias circuit for providing a bias voltage between 1.5V and 2.0V to the TIA input port.

BRIEF DESCRIPTION OF THE DRAWINGS

Exemplary embodiments of the invention will now be described in conjunction with the following drawings, in which.

DETAILED DESCRIPTION OF THE INVENTION

Figure 1:
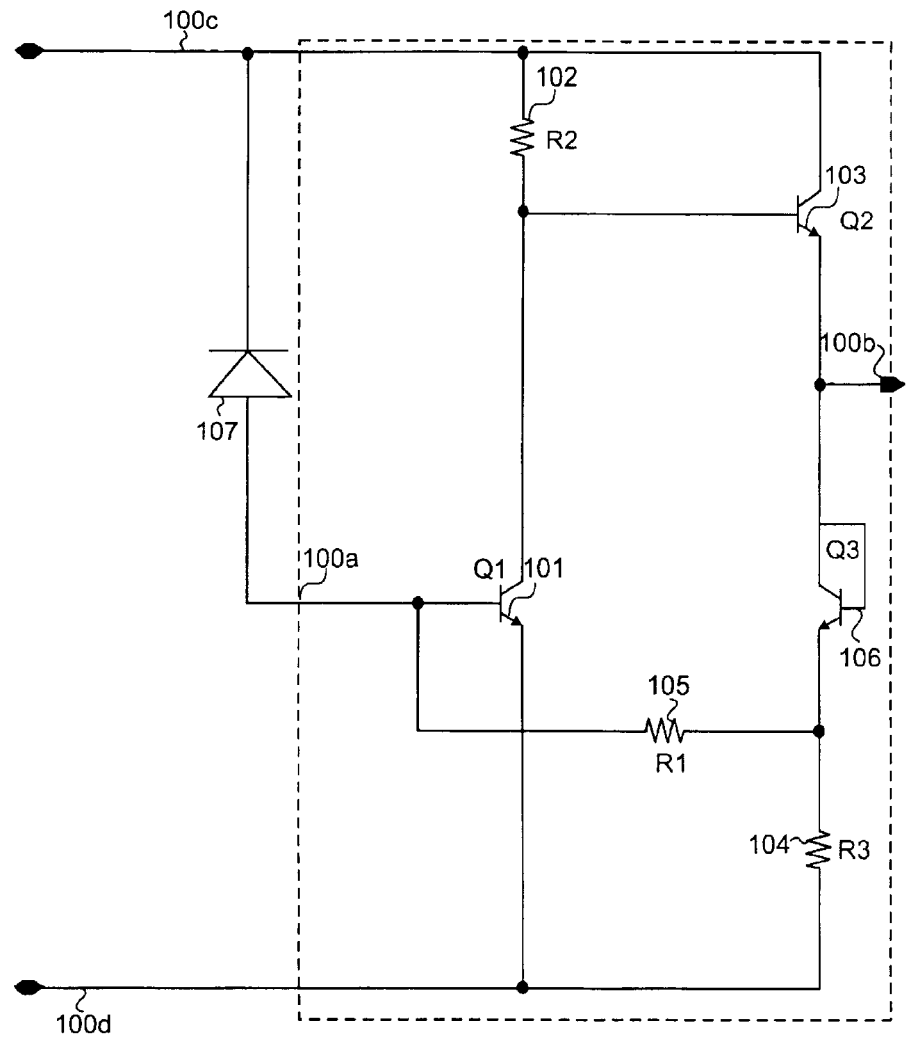
FIG. 1 illustrates a prior art common emitter transimpedance amplifier (TIA) that uses a fixed input port bias voltage.

FIG. 1 illustrates a commonly used first stage transimpedance amplifier (TIA) 100 arranged in a common emitter configuration. A collector terminal of transistor Q1 101 is connected in series with a load resistor R2 102 to a first voltage input port 100c, preferably at a positive supply voltage and an emitter terminal of the input transistor Q1 101 is connected to a second voltage input port 100d, which is at a potential below that of the first voltage input port 100c and is preferably connected to ground. A base terminal of the input transistor 101 is connected to receive current for amplification, such as photocurrent from a photodiode 107, preferably in the form of a PIN diode 107 having its anode coupled to a TIA input port 100a and its cathode coupled to the first voltage input port 100c. In this typical configuration, the base terminal of the input transistor Q1 101 has a potential of one Vbe above ground and thus has an approximate potential of 0.8V. The collector terminal of the input transistor Q1 101 is optionally connected to cascode transistors (not shown) or to a load resistor R2 102. Transistor Q2 103 and resistor R3 104 in combination with a feedback resistor R1 105 provide an emitter follower circuit. The emitter of transistor Q2 103 is used to provide a closed loop path in combination with a feedback resistor R1 105 to form a shunt feedback circuit for shunting of an output signal of the TIA 100. This shunt feedback circuit is used to set the gain of the TIA 100. Transistor Q3 106, disposed in a diode configuration, is used to provide a DC level shift in the output signal provided from the TIA output port 100b. This DC level shift facilitates the connection of the first stage TIA 100 to a subsequent signal processing stage (not shown) connected thereto.

Connecting the emitter terminal of the input transistor Q1 101 directly to ground allows for a maximum open loop gain to be provided by the first stage TIA 100. This connection allows for the use of a high value feedback resistance R1 105 and offers reduced input signal noise. Unfortunately, although the common emitter configuration shown in FIG. 1 is often used to provide a low noise TIA 100, this low noise performance is achieved at the expense of high overload performance. The base voltage of input transistor Q1 101 determines the voltage drop across R3 104. Assuming that negligible base current is flowing in the input transistor Q1 101, the voltage drop across R3 104 is approximately 0.8V, which is the Vbe of the input transistor Q1 101. Unfortunately, this voltage drop restricts the amount of voltage swing at the emitter terminal of output transistor Q2 103 and thus restricts the amount of voltage swing at the TIA output port 100b. Of course, reducing the value of the feedback resistor R1 105 reduces the voltage swing at the output port 100b, but the resulting decrease in gain results in increased output signal noise. In addition, a maximum reverse voltage for the PIN diode 107 of 2.5V is provided, for a positive supply voltage of 3.3V, which reduces the PIN diode 107 capacitance.

Figure 2:
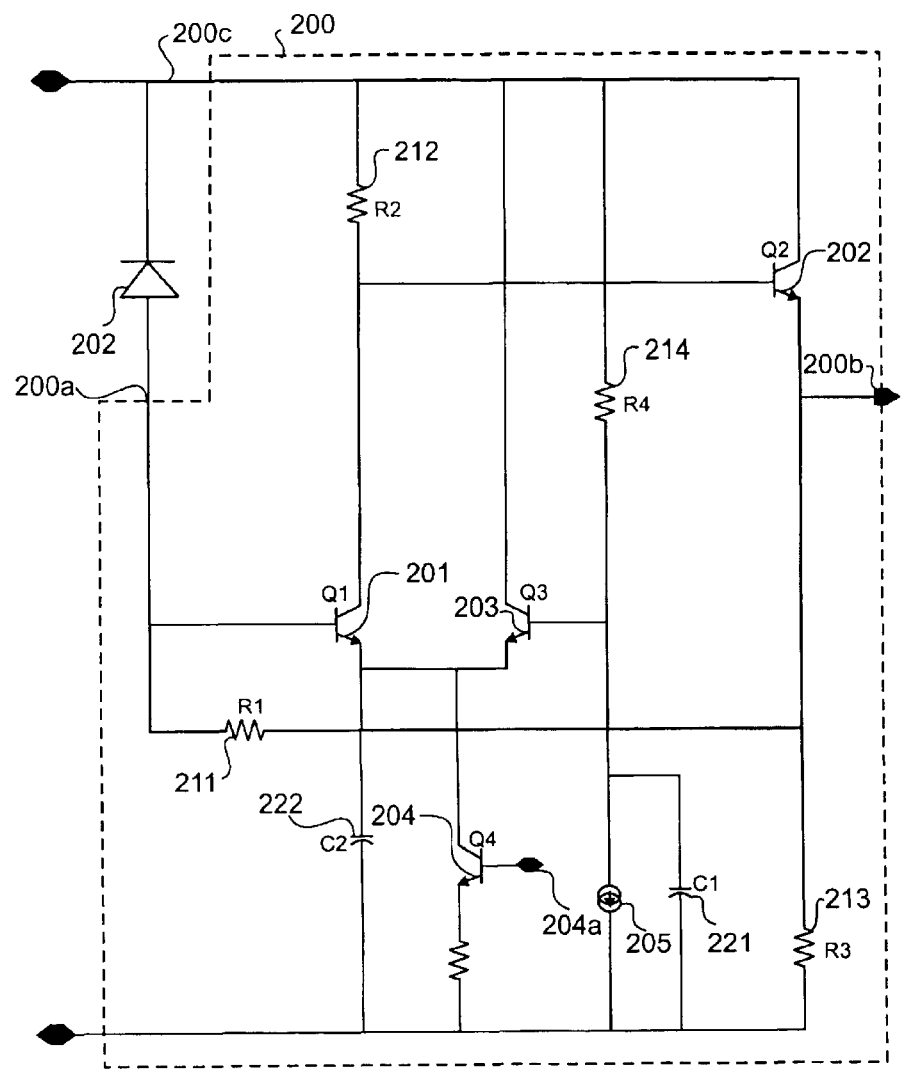
FIG. 2 illustrates an elevated front end TIA (EFTIA)

An alternative approach to that shown in FIG. 1 is to elevate the input bias voltage of the TIA input port above one Vbe, as is shown in FIG. 2. FIG. 2 illustrates an elevated front end TIA (EFTIA) 200. An EFTIA input port 200a is provided for receiving a current from a photodiode 207 having an anode terminal coupled thereto. An EFTIA output port 200b is provided for providing an amplified signal therefrom. A cathode of the PIN diode 207 is coupled to a first voltage input port 200c for receiving a positive supply voltage, preferably having a potential of 3.3V. A second voltage input port 200d is provided on the EFTIA 200 for receiving a voltage at preferably a ground potential.

Transistors Q1 201 and Q3 203 form a first long tail pair having emitter terminals of transistors Q1 201 and Q3 203 connected to a collector terminal of transistor Q4 204, which forms a first current source having a first bias port 204a for controlling the current provided therefrom. Optionally, the collector terminal of Q1 201 is connected to a cascode transistor (not shown) or as is shown in FIG. 2, in series with a load resistor R2 212 and the first voltage input port 200c. An emitter follower circuit is provided by transistor Q2 202 and resistor R3 213, which provide a closed loop signal path to the EFTIA input port 200a using resistor R1 211. This closed loop signal path provides shunt feedback that is used in providing the gain for the EFTIA 200. A bias voltage, Vpos−1.5V is provided by the second current source (12) 205 and resistor R4 214 connected to the base terminal of transistor Q3 203. Capacitor C1 221 connected in parallel with the second current source 205 is used to provide an AC ground and to limit the amount of thermal noise generated by resistor R4 214 disposed between the first voltage input port 200c and an output port of the second current source 205. Load resistor R2 212 is used to set a collector current for transistor Q1 201. To provide reduced EFTIA noise, the collector current of transistor Q3 203 is preferably much greater than the collector current of transistor Q1 201, thus ensuring that the emitter terminal of transistor Q3 203 provides low AC impedance. However, at high frequencies, the emitter of transistor Q3 203 begins to appear as a high impedance path, therefore the shunt capacitance C2 222, disposed for connecting the emitter terminal of transistor Q1 201 to the second voltage input port 200c provides a low impedance path for these high frequencies to ground, thus providing low noise and high open loop gain for the EFTIA 200. By providing a bias voltage of Vpos−1.5V to the base terminal of transistor Q3 203, the base terminal of transistor Q1 201 is approximately equal in potential to the base terminal voltage of transistor Q3 203 and thus a reverse bias voltage of 1.5V is provided to the PIN diode 207.

Although the common emitter configuration TIA 100 shown in FIG. 1 is often used to provide a low noise TIA 100, this low noise operation is at the expense of high overload performance, since the voltage across resistor R3 104 is determined by the base voltage of transistor Q1 101 and is thus at a potential of only 0.8V-assuming of course that transistor Q1 101 has negligible base current flowing therein. This unfortunately restricts the amount of voltage swing at the emitter terminal of transistor Q2 103 and thus restricts the amount of voltage swing at the output port 100b of the common emitter TIA. Reducing the value of the feedback resistor R1 105 reduces the voltage swing at the output port 100b, but with the resulting decrease in amplifier gain, there is an increase in circuit noise. In addition, the potential difference developed across resistor R2 102 divided by the thermal voltage ($V_t$) of transistor Q1 101, where $V_t$ equals approximately 25 mV, determines the open loop gain of the common emitter TIA 200. Unfortunately, the open loop gain is dependent upon the supply voltage variation of Vpos provided to the first voltage input port 100c. Furthermore, with low voltages of operation where Vpos=3.3V, this issue is exacerbated.

The EFTIA design shown in FIG. 2 advantageously provides greater overload performance than the common emitter design shown in FIG. 1, since the voltage drop across resistor R3 213 is determined by the base voltage of transistor Q3 203 and is thus at a potential of Vpos−1.5V. In addition, the voltage across load resistor R2 212 is no longer supply voltage (Vpos) dependant and thus a constant open loop gain is realized for the EFTIA 200. The input port bias voltage 200a is maximized at 1.5V (Vpos−1.5V), since below this voltage the constant current source formed from transistor Q4 204 saturates. As such, the available reverse voltage bias range provided for the PIN diode 207 from the two circuit techniques shown in FIG. 1 and FIG. 2 is 2.5V or 1.5V, respectively. If an EFTIA input port bias voltage is preferred above 0.8V but below 1.5V then the circuits shown in FIG. 1 and FIG. 2 are unable to provide this amount of reverse bias voltage.

Figure 3:
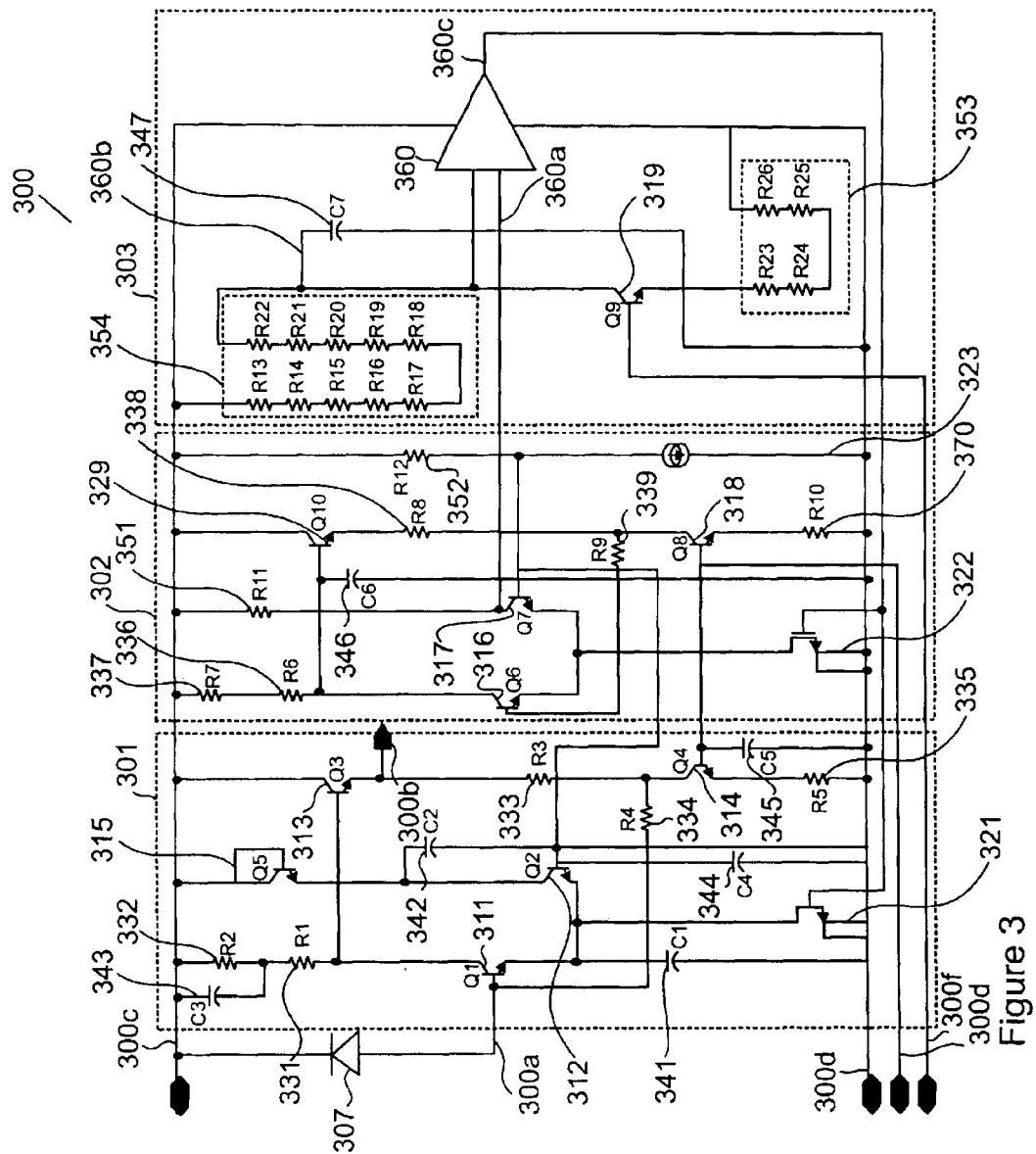
FIG. 3 illustrates a triode region MOSFET current source in accordance with an embodiment of the invention for biasing of a TIA.

FIG. 3 illustrates an embodiment of the invention, an amplifier circuit architecture 300 that provides a 10.3V input port bias voltage for a long wavelength—1300 nm–1500 nm—PIN diode 307 for use with optical signals clocked at over 10 Gbit/s. This amplifier circuit architecture 300 is preferably fabricated using a BiCMOS process. As is illustrated in FIG. 3, the amplifier circuit architecture 300 is divided into three parts, an EFTIA Stage 301 (similar to that illustrated in FIG. 2), a dummy EFTIA Stage 302 (similar to that illustrated in FIG. 2) and a Feedback Control circuit 303. The EFTIA stage 301 comprises first and second transistors Q1 311 and Q2 312, which form a first long tail pair, with the emitter terminals of transistors Q1 311 and Q2 312 connected to the drain of MOSFET M1 321, which forms a first MOSFET current source for providing a first current therefrom. A first current source formed by transistor Q4 314 and resistor R5 335 is used to provide a third current, in the form of a preferably constant current, to the emitter follower provided by transistor Q3 313 and resistor R3 333.

Resistor R3 333 is used to provide a constant voltage drop, which provides a DC level for an output voltage for use in connecting the EFTIA stage 301 output port 300b to a subsequent signal processing stage (not shown). Shunt feedback resistor R4 334 is connected between the base terminal of transistor Q1 311 and the collector terminal of transistor Q4 314, which forms part of the first current source. Resistors R1 331 and R2 332 determine the collector current of transistor Q1 311, while capacitor C3 343 is used to provide a 'zero pole' compensation and to aid closed loop stability of the EFTIA stage 301. The collector current of transistor Q1 311 is predetermined to be at a value that provides low noise performance, while the collector current of transistor Q2 312 is arranged to provide a much higher collector current, as compared to the collector current of transistor Q1 311, to ensure that at low frequencies the emitter terminal of transistor Q2 312 appears as a low impedance, which terminates at a base capacitance of capacitor C4 344, disposed between the base terminal of transistor Q2 312 and the second voltage input port 300d. At high frequencies, however, the emitter terminal of transistor Q2 312 appears as a high impedance, therefore shunt capacitance C1 341 provides a low impedance path for these high frequency signals to the second voltage input port, which is preferably coupled to ground. This arrangement thus provides low noise and high open loop gain for the EFTIA stage 301. Transistor Q5 315 disposed in a diode configuration is used to limit the Vce voltage of transistor Q2 312 provided from the first voltage input port 300c. Capacitors C2 342 and C5 345 are used to limit amplification noise in the EFTIA stage 301.

The bias voltage applied to the base terminal of transistor Q2 312 is determined by resistor R12 352 and a fourth current supplied from the second current source 323, disposed in the EFTIA Dummy stage 302. Preferably, the bias voltage has a potential of Vpos−1.3V. This provides a potential difference between Vpos and the base terminal of transistor Q1 311 that results in a preferably constant 2V reverse bias voltage being provided to the PIN diode 307. In the Dummy EFTIA stage 302, a bias control port 300d is coupled to the base terminal of transistor Q4 314 and to the base terminal of transistor Q8 318. Transistors Q6 316 and Q7 317 form a second long tail pair and have their emitter terminals coupled to the drain of MOSFET M2 322, which forms a second MOSFET current source and provides a second current. A third current source is formed by transistor Q8 318 and resistor R10 370, and it is used to provide a fifth constant current for the emitter follower provided by transistor Q10 329 and resistor R8 338. Resistor R9 339 disposed between the collector terminal of transistor Q8 318 and the base terminal of transistor Q6 316 is used to form a feedback path within the Dummy EFTIA stage 302. Resistors R7 337 and R6 336 are used to provide a predetermined voltage drop from the first voltage input port to the base terminal of transistor Q10 329 and the collector terminal of transistor Q6 316. The bias control port 300d is used to set a third current provided by the first current source, including transistor Q4 314, and a fifth current provided by the third current source, including transistor Q8 318, in order to control the DC bias at the base terminals of transistors Q1 311 and Q6 316, respectively.

To provide a 2V reverse bias voltage for the PIN diode 307, the first MOSFET current source formed by MOSFET M1 321 preferably operates with 0.5V potential difference between its drain and source terminals (Vds=500 mV). This causes MOSFET M1 321 to operate in the triode region of operation.

If a fixed bias voltage is applied to the gate terminal of MOSFET M1 321, then the current at the drain terminal of MOSFET M1 321 varies with the potential on the first supply voltage input port 300c (Vpos). This unfortunately alters the DC bias conditions of the input port 300a for the EFTIA stage 310. To prevent this altering of the DC bias condition, the Dummy EFTIA stage preferably replicates the DC operating conditions of the EFTIA stage 301.

Within the Dummy EFTIA stage 302, the transistor Q5 315 disposed in a diode configuration, found in the EFTIA stage 301, is optionally replaced with a resistor R11 351. The value of resistor R1 1 351 is predetermined to provide a same voltage drop across its terminals as that realized by transistor Q5 315. Capacitor C6 346 is used to provide amplification stability in the Dummy EFTIA stage 302 and to reduce noise therein. The voltage at the collector terminal of transistor Q7 317 is applied to a positive input port 360a of an operational amplifier 360 disposed with the Feedback Control Circuit 303. A proportional to absolute temperature (PTAT) current source is formed by transistor Q9 319 and resistors R23 through R26 353 disposed in series between a transistor Q9 319 emitter terminal and the second voltage input port 300d. This PTAT current source is used to provide a same potential difference across resistors R13 through R22 354, disposed in series between first voltage input port 300c and a negative input port 360b of operational amplifier 360, as is provided across resistor R1 1 351 disposed within the Dummy EFTIA stage 302. This PTAT current source, however, provides approximately $1/10^{th}$ the current that flows through the collector terminal of transistor Q7 317, which has an approximately equal collector current to that of transistor Q2 312. Capacitor C7 347 is used to limit thermal noise contributions of resistors R13–R22 354.

The operational amplifier 360 output port 360c is connected to the gate terminal of MOSFET M2 322 and MOSFET M1 321 for providing a closed circuit loop. An output signal, in the form of a feedback signal, from the operational amplifier output port 360c is provided as a "master" signal, in the form of a fourth bias voltage, to the gate terminal of MOSFET M2 322 and as a "slave" signal, in the form of a first bias voltage, to the gate terminal of MOSFET M1 321. This results in the current at the collector terminals of transistors Q7 317 and Q2 312 being determined by the PTAT current source formed by transistor Q9 319 and is thus independent of first voltage input port 300c supply voltage (Vpos) variation and the triode region characteristic of MOSFETS M1 321 and M2 322. A PTAT current source bias port 300f coupled to the base terminal of transistor Q9 319 is provided for externally controlling the amount of current provided by the PTAT current source 319.

Optionally, a resistor is used within the circuit of FIG. 3 to replace MOSFET M1 321, which provides the first current at the emitter terminals of transistors Q1 311 and Q2 312. However, if this substitution is made then the bias voltage applied to transistor Q2 312 is no longer independent of the first voltage input port 300c voltage fluctuations, which unfortunately results in the open loop gain of the EFTIA stage 301 varying in gain with variations in Vpos. Further optionally, the PTAT current source 319 formed by transistor Q9 319 is designed to provide a constant controllable current in response to an external signal received at the PTAT current source bias port 300f.

Advantageously, by using the circuit illustrated in FIG. 3, an approximately 2V reverse bias voltage is provided for reverse biasing of the PIN diode 307, while a constant open loop amplifier gain is provided thereto. This is advantageous over the circuit shown in FIG. 1 since the input bias voltage is pre-determined to be at a potential of greater than Vbe, thus improving overload. The embodiment of the invention is also advantageous over that shown in FIG. 2 because the EFTIA of FIG. 2 only allows for a 1.5V reverse bias voltage to be provided to the PIN diode 307. Having a larger reverse bias voltage provided to the PIN diode 307 advantageously allows for wide dynamic range operation of the TIA 300.

The embodiment of the invention advantageously provides a reverse bias voltage on the PIN diode and thus the PIN diode exhibits minimum—or reduced—detector capacitance. With minimal detector capacitance higher optical data rates are receivable by the PIN diode. The embodiment of the invention also allows for high overload performance since a higher input port bias voltage, than that which is attainable in the prior art, is provided thereto. Because of the higher PIN diode reverse bias voltage, the PIN diode capacitance is not increased and the PIN diode sensitivity is not decreased. Thus, the input port bias voltage provided by the embodiment of the invention offers both high sensitivity and overload performance when used with a PIN diode coupled thereto.

Furthermore, the embodiment of the invention is formable using a BiCMOS process that allows for the integration of the amplifier circuit 300 into single die. This allows for the photodetector to be directly attached to the die and thus facilitates the formation of a compact receiver package.

Numerous other embodiments may be envisaged without departing from the spirit or scope of the invention.

What is claimed is:

1. A circuit comprising:
   a transimpedance amplifier (TIA) circuit comprising a TIA input port, a first supply voltage input port, a second supply voltage input port, and a first amplification stage;
   a first MOSFET current source for receiving a feedback signal and for providing a first current to the first amplification stage; and,
   a feedback circuit for providing the feedback signal to the first MOSFET current source;
   a dummy TIA stage for replicating DC characteristics of the TIA circuit and for providing a control signal to the feedback circuit; and,
   a bias circuit for providing a bias voltage within a predetermined range below a first potential of the first supply voltage input port to the TIA input port.

2. A circuit according to claim 1, wherein the first MOSFET current source comprises a first MOSFET for operating in a triode region for providing the first current, the first current being relatively insensitive to at least one of temperature, DC supply voltage, and first MOSFET manufacturing tolerances.

3. A circuit according to claim 1, wherein the dummy TIA stage comprises a second MOSFET current source for receiving the feedback signal and for providing a second current to the dummy TIA stage.

4. A circuit according to claim 3, wherein the second MOSFET current source comprises a second MOSFET for operating in a triode region for providing the second current.

5. A circuit according to claim 1, comprising a PIN diode connected to the TIA input port, where a reverse bias voltage available to the PIN diode is between 2.0V and 1.5V.

6. A circuit according to claim 1, wherein the bias voltage is between the 1.5V and 2.0V.

7. A circuit according to claim 1, wherein the first supply voltage input port is at a first potential and the second supply voltage input port is at second potential, the circuit comprising a PIN diode, where a reverse bias voltage available to the PIN diode is between the first potential minus 1.8V and the first potential minus 1.3V relative to the second potential, which is lower than the first potential.

8. An amplifier circuit according to claim 1, wherein the TIA input port has a potential of approximately 2.0V with respect to the second supply voltage input port when approximately a potential of 3.3V is applied to the first supply voltage input port and a ground potential is applied to the second supply voltage input port.

9. A circuit according to claim 1, wherein the first amplification stage comprises a first long tail pair of transistors including a first transistor having a base terminal coupled with the TIA input port for receiving the input signal and a second transistor, the emitter terminals of both transistors for receiving the first current from the first MOSFET current source.

10. A circuit according to claim 3, wherein the dummy TIA stage comprises a second long tail pair of transistors including a sixth transistor and a seventh transistor, the emitter terminal of each transistor for receiving the second current from the second MOSFET current source.

11. A circuit according to claim 1, wherein the feedback control circuit comprises an operational amplifier having a positive input port, a negative input port and an output port, the operational amplifier for providing the feedback signal to the first MOSFET current source and the second MOSFET current source, from the output port thereof.

12. A circuit according to claim 11, wherein the feedback control circuit comprises a proportional to absolute temperature (PTAT) current source, the PTAT current source for providing a controllable PTAT output signal to the negative input port of the operational amplifier.

13. A circuit according to claim 10, wherein the feedback control circuit comprises an operational amplifier having a positive input port and a negative input port, the operational amplifier for providing the feedback signal to the first and second MOSFET current sources, the positive input port of the operational amplifier for connecting to a collector terminal of the seventh transistor from the second long tail pair.

14. An amplifier circuit according to claim 10, comprising a second current source, the second current source for providing a fourth current to the base terminal of the second transistor and the base terminal of the seventh transistor disposed in the first and second long tail pairs, respectively.

15. An amplifier circuit according to claim 10, wherein the feedback control circuit comprises a proportional to absolute temperature (PTAT) current source, the PTAT current source for determining a collector current for the second transistor and the seventh transistor, wherein each collector current is independent of first supply voltage input port potential variation and is independent of the triode region performance variations of first and second MOSFET current sources.

16. A circuit comprising:
a transimpedance amplifier (TIA) circuit comprising a TIA input port, a first supply voltage input port, a second supply voltage input port, and a first amplification stage;
a first MOSFET current source for receiving a feedback signal and for providing a first current to the first amplification stage; and,
a feedback circuit for providing the feedback signal to the first MOSFET current source;
a dummy TIA stage for replicating DC characteristics of the TIA circuit and for providing a control signal to the feedback circuit;
a bias circuit for providing a reverse bias voltage within a predetermined range below a first potential of the first supply voltage input port to the TIA input port; and,
a PIN diode connected to the TIA input port, where the reverse bias voltage available to the PIN diode is between 2.0V and 1.5V.

17. A circuit comprising:
a transimpedance amplifier (TIA) circuit comprising a TIA input port, a first supply voltage input port, a second supply voltage input port, and a first amplification stage;
a first MOSFET current source comprising a first MOSFET for operating in a triode region for and for receiving a feedback signal and for providing a first current to the first amplification stage, the first current being relatively insensitive to at least one of temperature, DC supply voltage, and first MOSFET manufacturing tolerances;
a feedback circuit for providing the feedback signal to the first MOSFET current source;
a dummy TIA stage for replicating DC characteristics of the TIA circuit and for providing a control signal to the feedback circuit; and,
a bias circuit for providing a bias voltage between 1.5V and 2.0V to the TIA input port.

\* \* \* \* \*